(12) United States Patent
Venugopal et al.

(10) Patent No.: US 11,258,446 B2
(45) Date of Patent: Feb. 22, 2022

(54) NO-ENABLE SETUP CLOCK GATER BASED ON PULSE

(71) Applicant: Apple Inc., Cupertino, CA (US)

(72) Inventors: Vivekanandan Venugopal, San Jose, CA (US); Shuyan Lei, Sunnyvale, CA (US); Wenhao Li, Sunnyvale, CA (US); Hemangi U. Gajjewar, Sunnyvale, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 16/862,071

(22) Filed: Apr. 29, 2020

(65) Prior Publication Data

US 2021/0344344 A1 Nov. 4, 2021

(51) Int. Cl.
*H03K 3/017* (2006.01)
*H03K 5/04* (2006.01)
*H03K 7/08* (2006.01)
*H03K 19/094* (2006.01)
*H03K 17/284* (2006.01)
*G06F 1/10* (2006.01)

(52) U.S. Cl.
CPC .............. *H03K 19/094* (2013.01); *G06F 1/10* (2013.01); *H03K 17/284* (2013.01)

(58) Field of Classification Search
CPC ....... H03K 19/094; H03K 17/284; G06F 1/10
USPC ........................................................ 327/176
See application file for complete search history.

(56) References Cited

U.S. PATENT DOCUMENTS

| | | | |
|---|---|---|---|
| 6,327,684 B1 | 12/2001 | Nadeau-Dostie et al. | |
| 6,434,704 B1 | 8/2002 | Dean et al. | |
| 6,536,024 B1 | 3/2003 | Hathaway | |
| 6,891,399 B2 * | 5/2005 | Ngo | G06F 1/08 |
| | | | 326/93 |
| 7,117,143 B2 | 10/2006 | Wang et al. | |
| 7,483,823 B2 | 1/2009 | Alfieri | |
| 7,567,893 B2 | 7/2009 | Torossian et al. | |
| 7,747,971 B1 | 6/2010 | Chopra et al. | |
| 7,750,680 B2 | 7/2010 | Mamidipaka | |
| 7,805,697 B2 | 9/2010 | Wood | |
| 7,913,222 B2 | 3/2011 | Ogilvie et al. | |
| 7,996,807 B2 | 8/2011 | Grise et al. | |
| 8,086,832 B2 | 12/2011 | Lichtensteiger et al. | |
| 8,104,012 B1 | 1/2012 | Klein et al. | |
| 8,132,144 B2 | 3/2012 | Sundaresan et al. | |
| 8,169,236 B2 | 5/2012 | Murray | |

(Continued)

*Primary Examiner* — Metasebia T Retebo
(74) *Attorney, Agent, or Firm* — Kowert Hood Munyon Rankin and Goetzel PC; Rory D. Rankin (57) ABSTRACT

Systems, apparatuses, and methods for implementing a high-performance clock-gating circuit are described. A first pull-down stack receives enable and pulse signals on gates of N-type transistors which pull down an output node when the enable and pulse signals are both high. A pull-up transistor coupled to the output node receives a clock signal which turns off the pull-up transistor when the clock signal is high. A first pull-up stack receives the inverted pulse signal and the enable signal on gates of P-type transistors to cause the output node to be high when the enable signal and inverted pulse signal are low. A second pull-up stack maintains a high voltage on the output node after the pulse event has ended but while the clock signal is still high. A second pull-down stack maintains a low voltage on the output node after the pulse event but while the clock remains high.

17 Claims, 12 Drawing Sheets

(56) References Cited

U.S. PATENT DOCUMENTS

| | | |
|---|---|---|
| 8,219,946 B1 | 7/2012 | Manovit et al. |
| 8,291,364 B2 | 10/2012 | Panigrahi et al. |
| 8,347,123 B2 | 1/2013 | Schultz |
| 8,378,713 B2 | 2/2013 | Suzuki |
| 8,533,648 B2 | 9/2013 | Sundaresan et al. |
| 8,572,534 B2 | 10/2013 | Czeck et al. |
| 8,572,539 B2 | 10/2013 | Cortadella et al. |
| 8,756,557 B2 | 6/2014 | Ng et al. |
| 9,129,708 B2 | 9/2015 | Campbell et al. |
| 9,672,305 B1 | 6/2017 | Vats et al. |
| 2006/0149526 A1 | 7/2006 | Torossian et al. |
| 2008/0270099 A1 | 10/2008 | Yen et al. |
| 2008/0301604 A1 | 12/2008 | Itskovich et al. |
| 2011/0283125 A1 | 11/2011 | Sundaresan et al. |
| 2013/0002343 A1 | 1/2013 | Wong et al. |
| 2014/0125381 A1 | 5/2014 | Schreiber et al. |
| 2015/0036783 A1 | 2/2015 | Chen et al. |
| 2015/0220672 A1 | 8/2015 | Park |
| 2016/0065190 A1 | 3/2016 | Paul |

\* cited by examiner

NO-ENABLE SETUP CLOCK GATER BASED ON PULSE

BACKGROUND

Technical Field

Embodiments described herein relate to the field of circuits and, more particularly, to implementing a no-enable setup clock gater based on pulse.

Description of the Related Art

Digital electronic systems utilize a number of different types of synchronous circuits for controlling the movement of information. Sequential elements are used for storing and driving data in a variety of circuits such as general-purpose central processing unit (CPU), data parallel processors like graphics processing units (GPUs), digital signal processors (DSPs), and so forth. Modern processors are typically pipelined. For example, the processors include one or more data processing stages connected in series with sequential elements placed between the stages for storing and driving the data. The output of one stage is made the input of the next stage during each transition of a clock signal. The sequential elements typically are flip-flop circuits.

Flip-flops are commonly used and implemented in a wide variety of systems and circuits. A flip-flop circuit includes one or more data inputs, a clock input, and one or more data outputs. Logic signals may be received on the data input(s) of a flip-flop circuit. Responsive to an edge (e.g., a rising edge) of the clock signal, the logic values of these signals may be captured and stored in the flip-flop circuit, with these values being stored until another synchronizing edge (e.g., the next rising edge) is received. Between these edges, the flip-flop circuit stores the captured logic value.

Clock signals may be provided to these flip-flop circuits via a clock-gating circuit. Clock-gating circuits may be part of a clock tree (or clock distribution network) having a number of different levels. Clock-gating circuits that are coupled directly to clock consumers, such as the flip-flop circuits mentioned above, may be referred to as being at the leaf-level. When enabled, clock-gating circuits allow a received clock signal to propagate downstream to the clock consumers. Typically a clock-gating circuit includes a latch followed by an AND-gate, and the performance of a clock-gating circuit is dictated by how fast the latch can work. The enable signal goes through the latch and is registered by the latch, and the output of the latch is coupled to the AND-gate and either triggers or gates the clock.

The performance of the typical clock-gating circuit is dictated by the enable-to-clock setup time and the clock-to-Q propagation delay. The clock-to-Q propagation delay (i.e., clock-to-output delay) is caused by the AND-gate delay. The enable-to-clock setup time (i.e., setup time) is dependent on any logic in front of the latch as well as the latch setup time. A processor's performance is dependent at least upon the operating frequency of a clock signal. The duration of a clock cycle period corresponding to the operating frequency is determined by the amount of time required for processing of data between the flip-flop circuits. The clock cycle period increases based at least upon the setup time and the clock-to-output delay of the flip-flop circuit.

SUMMARY

Systems, apparatuses, and methods for implementing high performance clock-gating circuits based on pulse signals are contemplated. In one embodiment, a clock-gating circuit receives an enable signal and a clock signal, and the clock-gating circuit generates an output signal which corresponds to a state of the clock signal when the enable signal is high during a pulse event. In one embodiment, the clock-gating circuit includes a first pull-down stack which receives an enable signal and a pulse signal on gates of N-type transistors. The first pull-down stack pulls down an output node when both the enable signal and the pulse signal are high. An inverter can be coupled to the output node to generate the output clock signal, with the output clock signal being dependent on the state of the enable signal. A pull-up transistor coupled to the output node receives an input clock signal which turns off the pull-up transistor when the input clock signal is at a logic high level. When the input clock signal is at a logic low level, the pull-up transistor is enabled and the output node will be at the logic high level. In this case, the output of the inverter will be low when the input clock signal is low.

A first pull-up stack receives an inverted pulse signal and the enable signal on gates of P-type transistors to cause the output node to be high when both the enable signal and the inverted pulse signal are low. A second pull-up stack maintains a high voltage on the output node after the pulse event has ended but while the clock signal is still high. The second pull-up stack includes two P-type transistors gated by the pulse signal and a shadow latch signal. A second pull-down stack maintains a low voltage on the output node after the pulse event has ended but while the clock signal is still high. The second pull-down stack includes three N-type transistors gated by the shadow latch signal, a delayed clock signal, and the inverted pulse signal.

These and other embodiments will be further appreciated upon reference to the following description and drawings.

BRIEF DESCRIPTION OF THE DRAWINGS

The above and further advantages of the methods and mechanisms may be better understood by referring to the following description in conjunction with the accompanying drawings, in which.

While the embodiments described in this disclosure may be susceptible to various modifications and alternative forms, specific embodiments thereof are shown by way of example in the drawings and will herein be described in detail. It should be understood, however, that the drawings and detailed description thereto are not intended to limit the embodiments to the particular form disclosed, but on the contrary, the intention is to cover all modifications, equivalents and alternatives falling within the spirit and scope of the appended claims. As used throughout this application, the word "may" is used in a permissive sense (i.e., meaning having the potential to), rather than the mandatory sense (i.e., meaning must). Similarly, the words "include," "including," and "includes" mean including, but not limited to.

Various units, circuits, or other components may be described as "configured to" perform a task or tasks. In such contexts, "configured to" is a broad recitation of structure generally meaning "having circuitry that" performs the task or tasks during operation. As such, the unit/circuit/component can be configured to perform the task even when the unit/circuit/component is not currently on. In general, the circuitry that forms the structure corresponding to "configured to" may include hardware circuits. Similarly, various units/circuits/components may be described as performing a task or tasks, for convenience in the description. Such descriptions should be interpreted as including the phrase "configured to." Reciting a unit/circuit/component that is configured to perform one or more tasks is expressly intended not to invoke 35 U.S.C. § 112(f) for that unit/circuit/component.

DETAILED DESCRIPTION OF EMBODIMENTS

In the following description, numerous specific details are set forth to provide a thorough understanding of the embodiments described in this disclosure. However, one having ordinary skill in the art should recognize that the embodiments might be practiced without these specific details. In some instances, well-known circuits, structures, and techniques have not been shown in detail for ease of illustration and to avoid obscuring the description of the embodiments.

Figure 1:
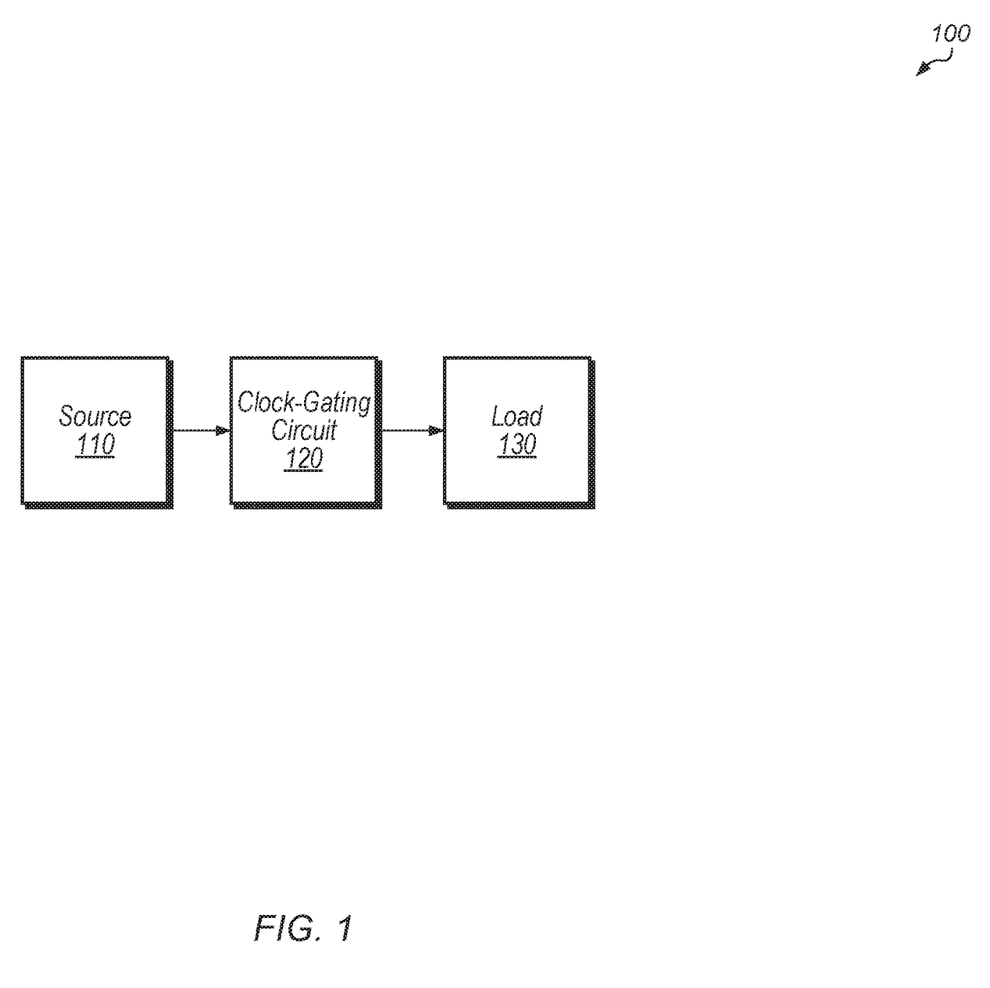
FIG. 1 is a generalized block diagram of one embodiment of an integrated circuit.

Referring to FIG. 1, a block diagram of one embodiment of an integrated circuit (IC) 100 is shown. In one embodiment, IC 100 includes source 110, clock-gating circuit 120, and load 130. It should be understood that IC 100 may also include any number of other components (e.g., voltage regulator, memory devices, processing elements) which are not shown to avoid obscuring the figure. Also, although only a single instance of source 110, clock-gating circuit 120, and load 130 are shown in FIG. 1, it should be understood that IC 100 may include multiple instances of source 110, clock-gating circuit 120, and load 130.

Source 110 is representative of any type of circuit element or logic gate that generates one or more signals which are connected to clock-gating circuit 120. In one embodiment, clock-gating circuit 120 is a no-enable setup clock gater based on a pulse signal. It is noted that clock-gating circuit 120 may also be referred to as a "clock gater". Examples of different ways of implementing clock-gating circuit 120 will be presented throughout the remainder of this specification. Load 130 is representative of any number and type of circuit elements, logic gates, and/or flip-flops for receiving the output of clock-gating circuit 120.

Figure 2:
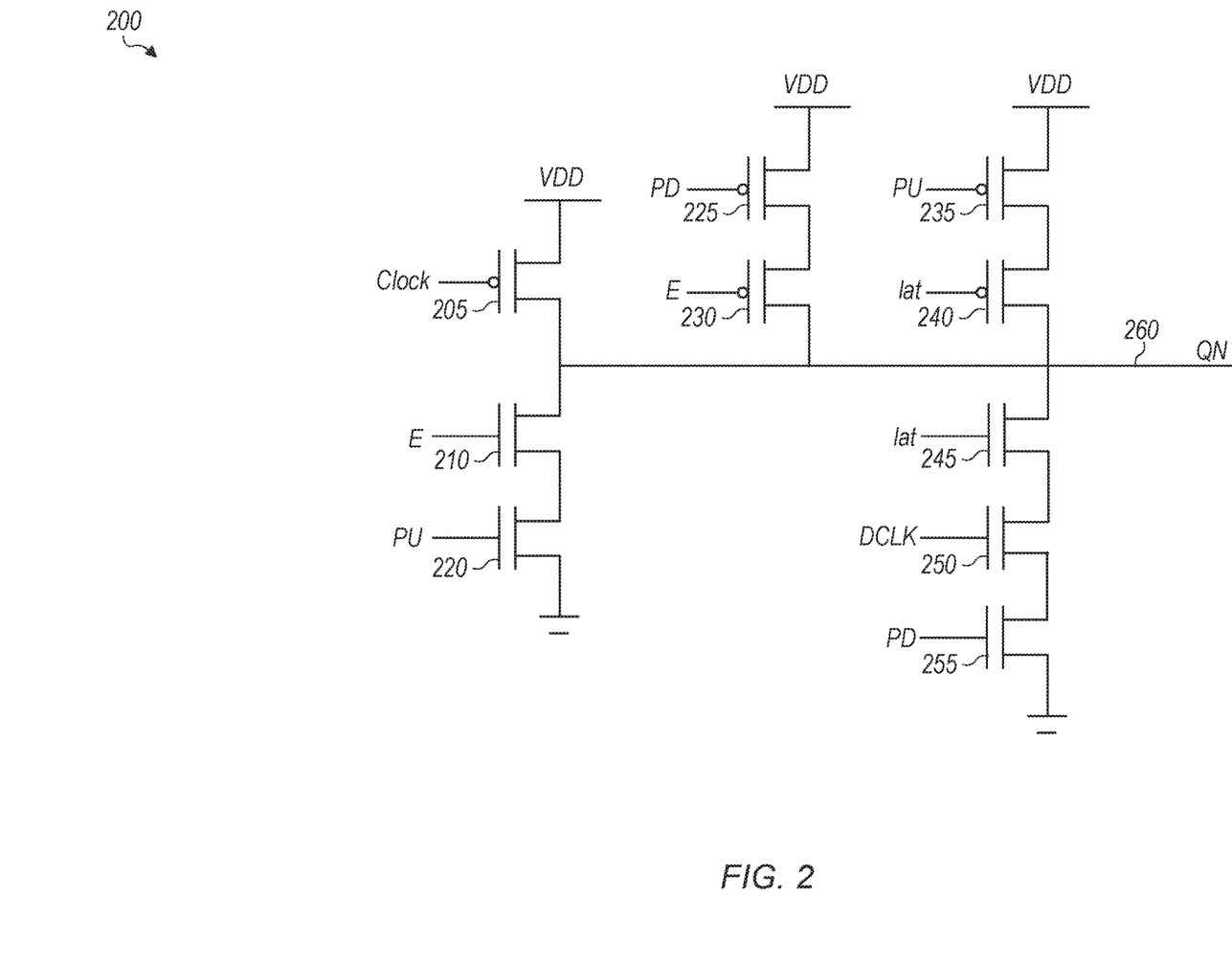
FIG. 2 is a circuit diagram illustrating one embodiment of a clock-gating circuit.

Turning now to FIG. 2, a circuit diagram of one embodiment of a clock gating circuit 200 is shown. In one embodiment, the components of clock-gating circuit 200 are included within clock-gating circuit 120 of IC 100 (of FIG. 1). The input clock signal is coupled to the gate of P-type transistor 205, with the source of P-type transistor 205 connected to the supply voltage (or VDD) and the drain connected to the output QN node 260. Accordingly, when the input clock signal is 0, P-type transistor 205 will be conducting, causing QN node 260 to be pulled up to 1. If QN node 260 is connected to an input of an inverter, the output of the inverter will be 0 in this case. As used herein, when a signal is equal to or relatively close to VDD, the signal is referred to as being "1" or "high". A "high" signal corresponds to a voltage level which is, when applied to a gate of an N-type transistor, sufficiently high enough to enable the N-type transistor (i.e., cause the N-type transistor to conduct). Otherwise, when a signal is equal to or relatively close to ground, the signal is referred to as being "0" or "low". A "low" signal corresponds to a voltage level which is, when applied to a gate of a P-type transistor, sufficiently low enough to enable the P-type transistor.

In one embodiment, a pulse generator (e.g., pulse generator 405 of FIG. 4) will create a high pulse (going from 0-to-1-to-0) on a rising clock edge. In other words, the clock edge triggers the high pulse. It is noted that the "high pulse" may also be referred to as a "pulse event" or a "pulse window". As used herein, a "pulse event" or a "pulse window" is defined as the period of time when a pulse signal is high. The pulse signal generated by the pulse generator is designated as the signal "PU" in FIG. 2. Also, the inversion (i.e., logical complement) of the pulse signal is designated as the signal "PD" in FIG. 2. When the clock signal is high, P-type transistor 205 is off, which allows N-type transistors 210 and 220 to set the value of QN node 260. The enable signal "E" is coupled to the gate of N-type transistor 210, and the pulse signal "PU" is coupled to the gate of N-type transistor 220.

Accordingly, during the high pulse event, if enable is 1, N-type transistor 210 will be conducting and N-type transistor 220 will be conducting due to the pulse signal "PU" being high. This will cause QN node 260 to be immediately discharged. If there is an inverter coupled to QN node 260, then the output of the inverter will be 1. Otherwise, if enable is 0 during the high pulse event, the QN node 260 will be held high by the stack of P-type transistors 225 and 230. As shown, "PD" is coupled to the gate of P-type transistor 225 and the enable signal "E" is coupled to the gate of P-type transistor 230. When enable and PD are 0, transistors 225 and 230 will be conducting, causing the QN node to be pulled up to VDD. During the pulse window, "PU" is 1 and "PD" is 0. Accordingly, the value of the enable signal goes directly to the output "QN" when the enable signal arrives within the pulse window. In prior art circuits, there is a longer path between the enable signal and the output "QN". The above description describes the operation of clock-gating circuit 200 during the pulse window (i.e., when the pulse signal "PU" is 1). During the pulse window, the clock-gating circuit 200 generates a logic output signal whose value is dependent upon the logic value of the enable signal "E".

After the pulse event but while the clock is still high, a shadow latch (e.g., shadow latch 305 of FIG. 3) becomes operational. In other words, during the period of time when the clock is equal to 1 and the pulse is low (i.e., PU=0 and PD=1), the shadow latch comes into effect. The shadow latch is transparent until a given delayed version of the clock signal closes the shadow latch. Once the shadow latch closes, the shadow latch has captured the enable pin state. The shadow latch protects against glitches on the enable pin that occur after the pulse goes away but while the clock is high. The output of the shadow latch is designated as the signal "lat" in FIG. 2. As shown, the signal "lat" is coupled to the gate of P-type transistor 240 and to the gate of N-type transistor 245. P-type transistor 240 and P-type transistor 235 are part of a pull-up stack, while N-type transistors 245, 250, and 255 are part of a pull-down stack. If there is no pulse (i.e., PU=0) and the clock is still high, then the transistors of these two stacks will hold the existing state of QN node 260. If QN node 260 is 0 when the pulse event ends, the value of 0 will be held by the pull-down stack of N-type transistors 245, 250, and 255. If QN node 260 is 1 when the pulse event ends, the value of 1 will be held by the pull-up stack of P-type transistors 235 and 240.

It is noted that the signal designated as "DCLK" is a delayed version of the clock. DCLK is coupled to the gate of N-type transistor 250 and will cause N-type transistor 250 to conduct after the pulse event has occurred while the delayed version of the clock is high. When the main clock signal (or "clock") goes low, this turns on the P-type transistor 205. At the time when "clock" goes low, the "PD" signal is still high, which will cause a short-circuit current in the N-type pull-down stack with N-type transistors 245, 250, and 255 if all three of these N-type transistors are conducting. Having "DCLK" coupled to the gate of N-type transistor 250 prevents this short-circuit current by waiting to turn off this N-type pull-down stack until slightly after P-type transistor 205 is turned on.

Figure 6:
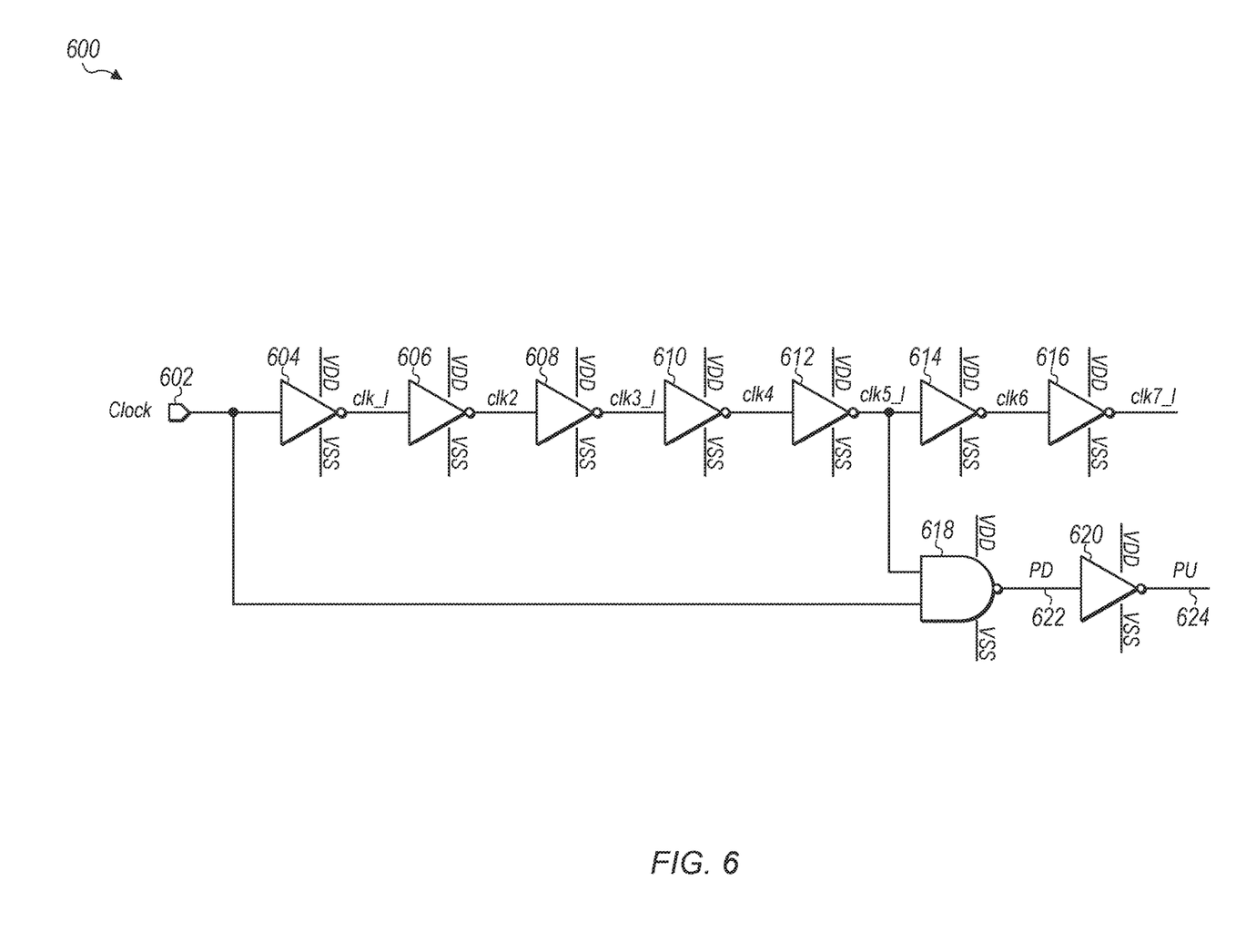
FIG. 6 is a circuit diagram of one embodiment of a pulse generator circuit.

In one embodiment, DCLK is a slightly delayed version of the clock rather than a very delayed version of the clock. For example, in FIG. 12, the buffered version "clk4" is coupled to the gate of the corresponding N-type transistor of clock-gating circuit 1200. In the example of clock-gating circuit 1200, a slightly delayed clock signal such as "clk4" is used rather than a very delayed (or "very late") clock such as the "clk6" clock signal. One example showing how the "clk4" and "clk6" signals are generated is shown in FIG. 6. In other embodiments, other delayed versions of the clock may be used for the signal designated as "DCLK" in clock-gating circuit 200.

N-type transistor 255 will also be conducting after the pulse event has ended since "PD" is connected to the gate of N-type transistor 255, with "PD" equal to 1 when the pulse event ends. Also, P-type transistor 235 will be conducting when the pulse event ends since the signal "PU" coupled to the gate of P-type transistor 235 will go low when the pulse event ends. This allows the value of the signal "lat" to determine the state of QN node 260 after the pulse event ends while the clock is still high. Accordingly, the previous value of QN node 260 will be maintained during this period of time since "lat" will be high after the pulse event if QN node 260 is low, or "lat" will be low after the pulse event if QN node 260 is high.

It is noted that, in various embodiments, a "transistor" can correspond to one or more transconductance elements such as a metal-oxide-semiconductor field-effect transistor (MOSFET), a junction field-effect transistor (JFET), a bipolar transistor, or others. For example, in one embodiment, each P-type transistor is a P-type metal-oxide-semiconductor field-effect transistor (MOSFET) and each n-type transistor is an n-type MOSFET. In other embodiments, the P-type transistors and N-type transistors shown in the circuits herein can be implemented using other types of transistors. It is also noted that the terms N-type and P-type can be used interchangeably with N-channel and P-channel, respectively. Although single devices are depicted in the circuit diagrams of this disclosure, in other embodiments, multiple devices may be used in parallel to form any of the above devices.

Figure 3:
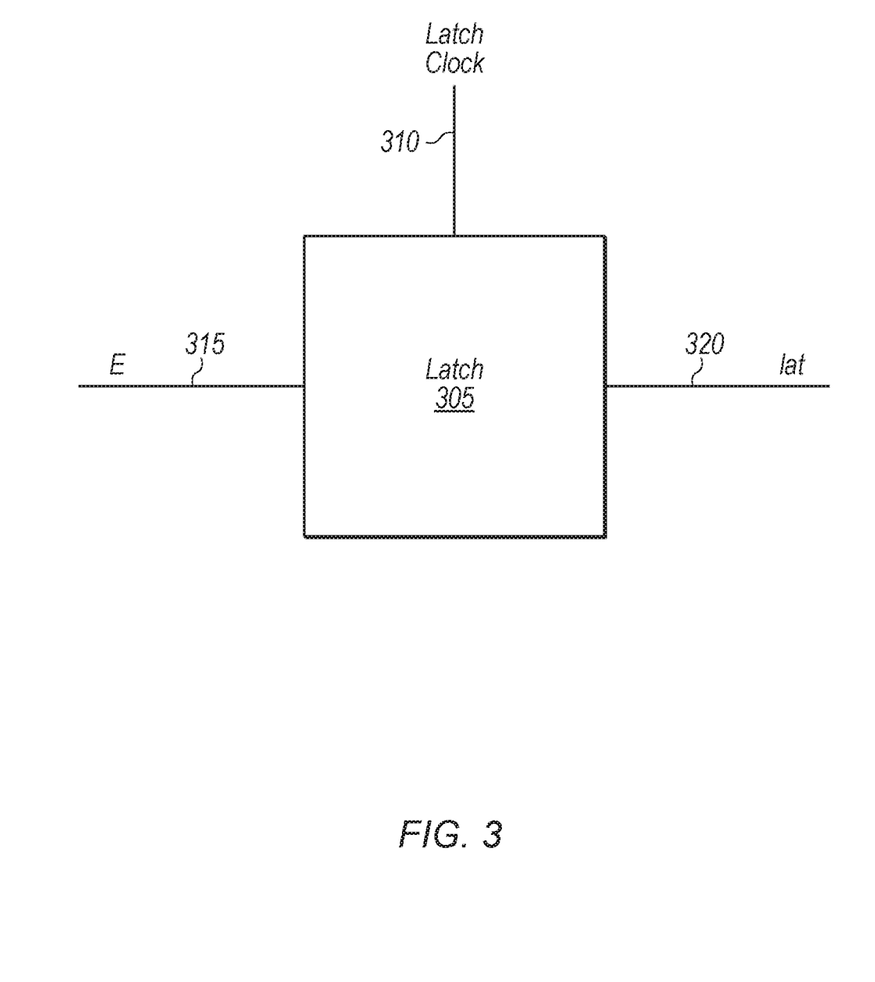
FIG. 3 is a block diagram illustrating one embodiment of a shadow latch.

Referring now to FIG. 3, a block diagram of one embodiment of a shadow latch 305 is shown. In one embodiment, shadow latch 305 receives the enable signal 315 or "E" which is also coupled to the gates of N-type transistor 210 and P-type transistor 230 of circuit 200 (of FIG. 2). Shadow latch 305 also receives a latch clock 310 which is a delayed version of the main clock signal. In one embodiment, the output 320 or "lat" of shadow latch 305 is coupled to the gates of P-type transistor 240 and N-type transistor 245 to enable circuit 200 to hold the value of QN node 260 after the pulse event has ended. Shadow latch 305 is transparent until latch clock 310 closes shadow latch 305. Once shadow latch 305 closes, enable signal 315 has been captured. Shadow latch 305 protects against glitches on the enable pin that occur after the pulse goes away but while the clock is high.

Figure 4:
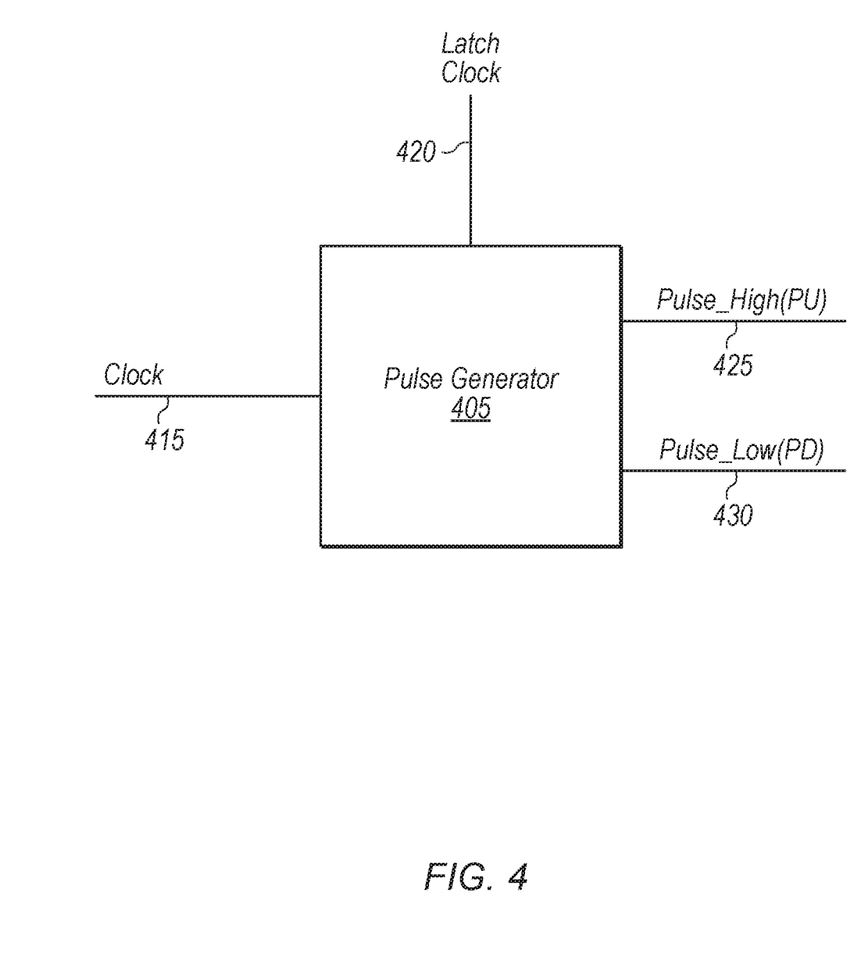
FIG. 4 is a block diagram of one embodiment of a pulse generator.

Turning now to FIG. 4, a block diagram of one embodiment of a pulse generator 405 is shown. In one embodiment, pulse generator 405 receives an input clock 415 and a latch clock 420. It is noted that the latch clock 420 is a delayed version of input clock 415. Pulse generator 405 generates a pulse_high signal 425 and a pulse_low signal 430, with the pulse_low signal 430 the inverse (or negated version) of the pulse_high signal 425. It is noted that the pulse_high signal 425 is also referred to herein as "PU" and the pulse_low signal 430 is also referred to herein as "PD". In one embodiment, the PU signal generated by pulse generator 405 is coupled to the gates of N-type transistor 220 and P-type transistor 235 of clock-gating circuit 200 (of FIG. 2). In one embodiment, the PD signal generated by pulse generator 405 is coupled to the gates of P-type transistor 225 and N-type transistor 255 of clock-gating circuit 200. One example of an implementation of pulse generator 405 is shown in FIG. 6. It is noted that the timing and width of the pulse signal generated by pulse generator 405 may be adjusted from embodiment to embodiment.

Figure 5:
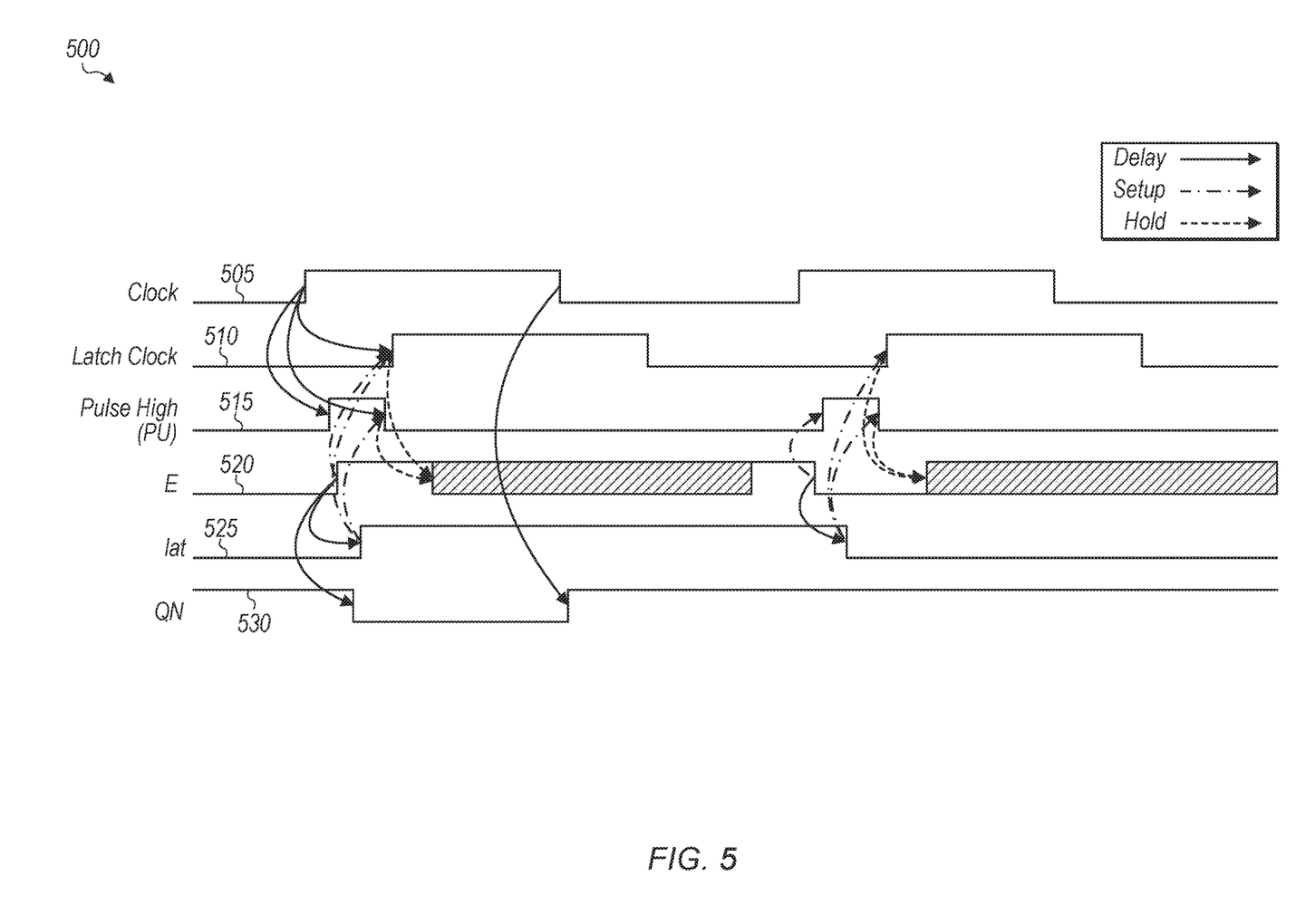
FIG. 5 is a timing diagram of one embodiment of the operation of a clock-gating circuit.

Referring now to FIG. 5, a timing diagram of one embodiment of the operation of a clock-gating circuit is shown. It is noted that the waveforms of timing diagram 500 correspond to the signals for clock-gating circuit 200 (of FIG. 2). These signals include clock 505, latch clock 510, pulse high (or PU) 515, enable (or E) 520, shadow latch (or lat) 520, and QN 530. As shown in timing diagram 500, when the rising edge of clock signal 505 occurs, there is a delay between the rising edge of clock signal 505 and the corresponding rising edge of latch clock 510. Also, there is a delay between the rising edge of clock signal 505 and the pulse high signal 515. These delays can be adjusted to meet the specific requirements of the target clock-gating circuit.

Based on the improved structure of clock-gating circuit 200, there is a relatively short delay from the enable signal 520 going high and QN 530 going low as compared to the prior art clock-gating circuits. As shown in timing diagram 500, since enable 520 transitions to a high value during the first pulse event, QN 530 goes low a short time delay later. However, during the second pulse event, since enable 520 is low, QN 530 will remain high during this time to effectively gate the clock 505. It is noted that an inverter may be used to invert QN 530 to generate a "Q" output signal of the clock-gating circuit.

Turning now to FIG. 6, a circuit diagram of one embodiment of a pulse generator circuit 600 is shown. Pulse generator circuit 600 receives a clock signal 602 which is coupled to the input of a chain of inverters 604, 606, 608, 610, 612, 614, and 616. It is noted that the number of inverters in the chain of inverters may vary according to the embodiment. In one embodiment, the output of inverter 612, labeled as "clk5_1", is coupled to one input of NAND-gate 618, while the clock signal 602 is coupled to the other input of NAND-gate 618. In other embodiments, the output of other inverters may be coupled to the inputs of NAND-gate 618 so as to generate the inverted pulse signal 622 and the pulse signal 624.

The output of NAND-gate 618 is the inverted pulse signal 622 or "PD" which is coupled to the gates of P-type transistor 225 and N-type transistor 255 of clock-gating circuit 200 (of FIG. 2). The output of NAND-gate 618 will be positive when either the output of inverter 612 is low or the clock signal 602 is low. The output of NAND-gate 618 is also coupled to the input of inverter 620. The output of inverter 620 is the pulse signal 624 or "PU" which is coupled to the gates of N-type transistor 220 and P-type transistor 235 of clock-gating circuit 200. It is noted that the example of pulse generator circuit 600 is merely indicative of one particular embodiment. In other embodiments, other types of pulse generator circuits with other arrangements of circuit elements may be utilized. For example, the pulse may be lengthened or shortened depending on the circuit requirements, and the delay between the clock rising edge and the pulse may be adjusted as desired. In some cases, pulse generator 600 may adjust the pulse signal based on commands received from software by tapping into different points of the inverter chain.

Figure 7:
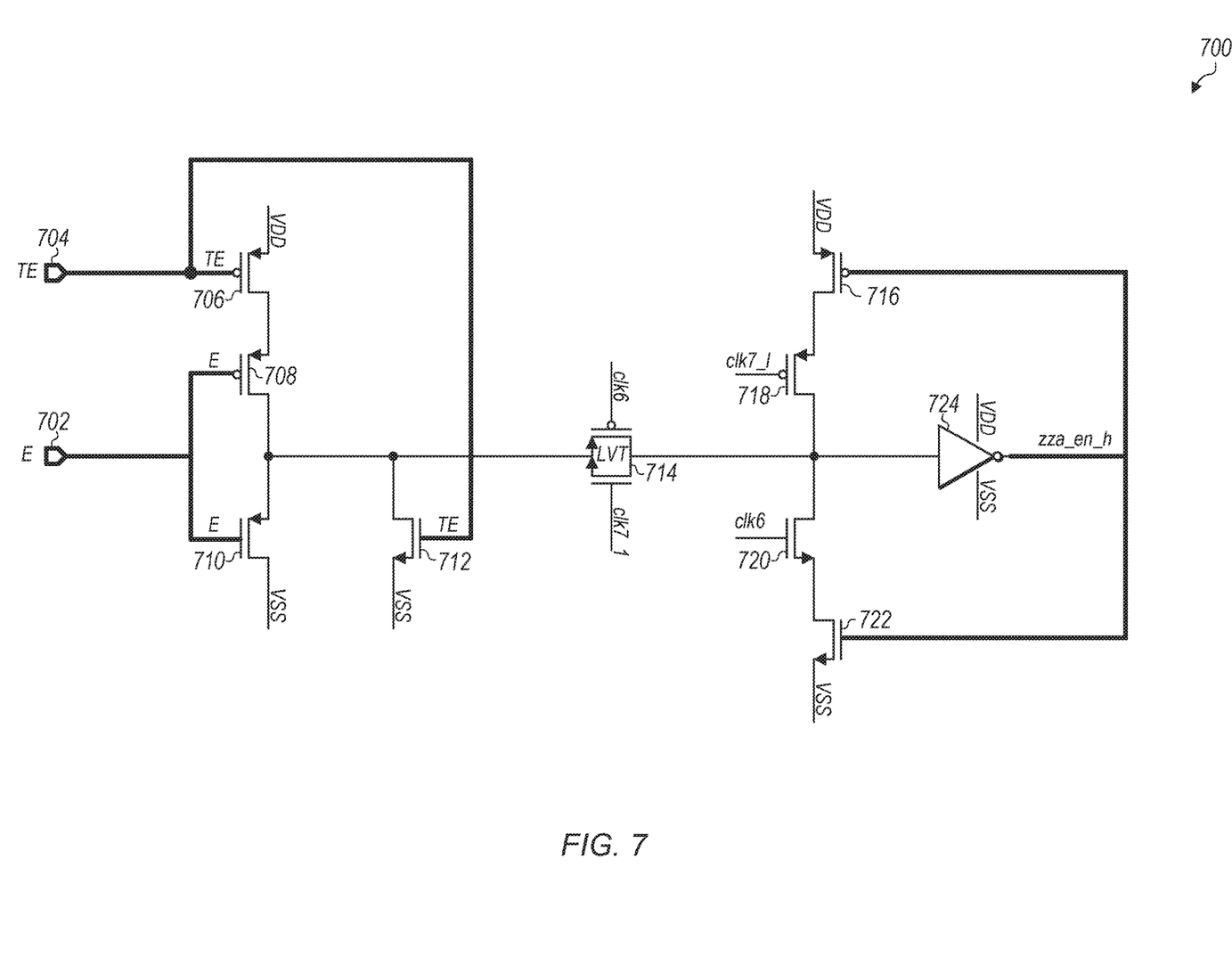
FIG. 7 is a circuit diagram of one embodiment of a shadow latch circuit with two enable pins.

Referring now to FIG. 7, a circuit diagram of one embodiment of a shadow latch circuit 700 with two enable pins is shown. Shadow latch circuit 700 includes a first enable pin 702 (or "E") and a test enable pin 704 (or "TE"). The first enable pin 702 is coupled to the gates of P-type transistor 708 and N-type transistor 710, while the second enable pin 704 is coupled to the gates of P-type transistor 706 and N-type transistor 712. In one embodiment, the second enable pin 704 is used during test operations, but may otherwise remain de-asserted. The drain of N-type transistor 712 is coupled to the input of transmission gate 714, while the output of transmission gate 714 is coupled to the drain of P-type transistor 718 and the drain of N-type transistor 720. In one embodiment, the delayed clock signal "clk7_1" generated by pulse generator circuit 600 (of FIG. 6) is coupled to the gate of P-type transistor 718, and the delayed clock signal "clk6" generated by pulse generator circuit 600 is coupled to the gate of N-type transistor 720. The drain of P-type transistor 718 is coupled to the input of inverter 724, and the output of inverter 724 is coupled to the gates of P-type transistor 716 and N-type transistor 722. In other embodiments, other types of shadow latch circuits with other arrangements of circuit components and/or other circuit and signal connections may be implemented.

Figure 8:
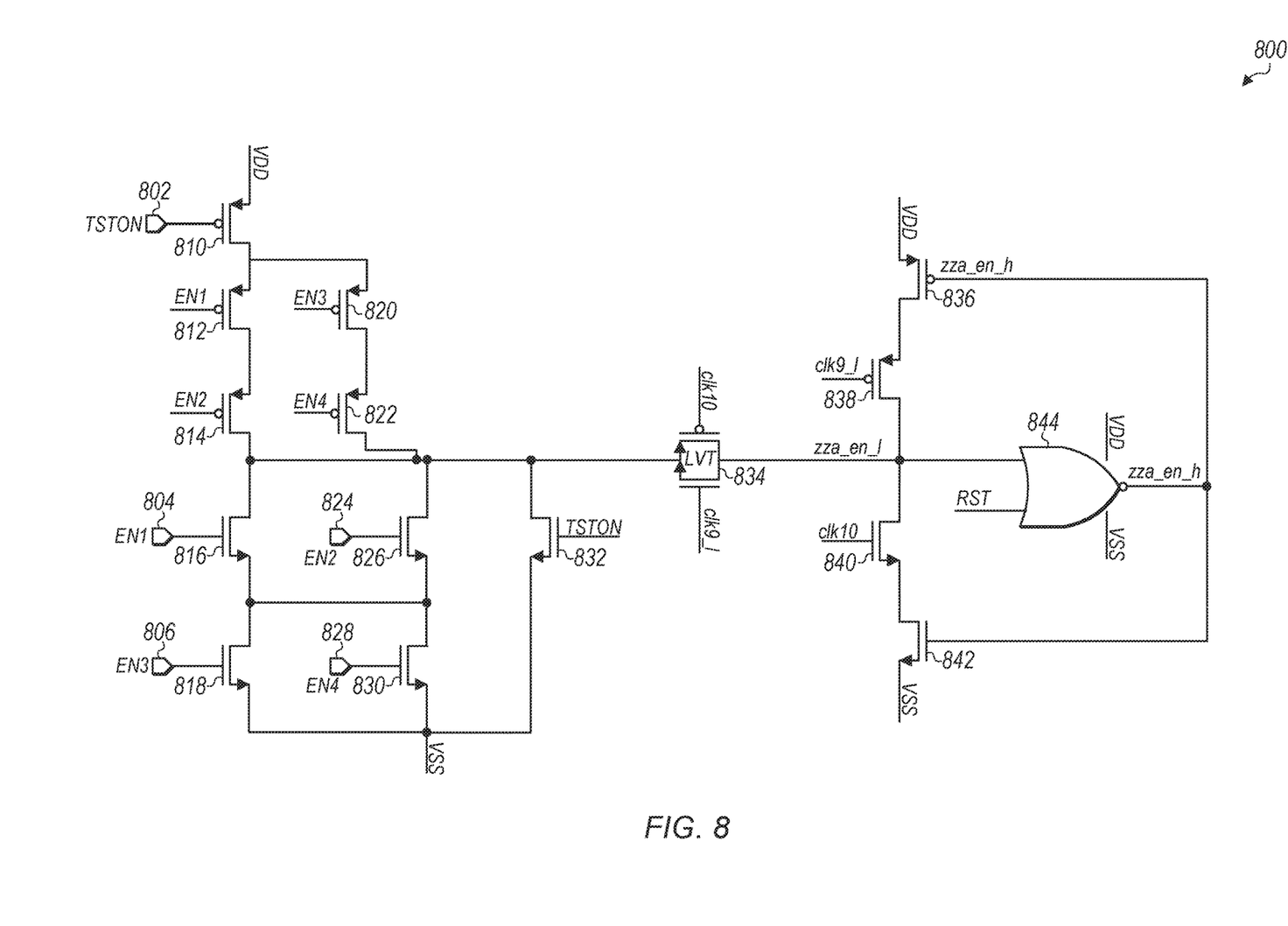
FIG. 8 is a circuit diagram of one embodiment of a shadow latch circuit with five enable pins.

Turning now to FIG. 8, a circuit diagram of one embodiment of a shadow latch circuit 800 with five enable pins is shown. While shadow latch circuit 700 (of FIG. 7) includes two enable pins, latch circuit 800 is an alternative implementation which has five enable pins. These enable pins are enable pin 804 (or EN1), enable pin 824 (or EN2), enable pin 806 (or EN3), enable pin 828 (or EN4), and enable pin 802 (or TSTON). Enable pin 804 is coupled to the gate of N-type transistor 816, enable pin 806 is coupled to the gate of N-type transistor 818, enable pin 824 is coupled to the gate of N-type transistor 826, enable pin 828 is coupled to the gate of N-type transistor 830, and enable pin 802 is coupled to the gate of N-type transistor 832. Also, enable pin 804 is coupled to the gate of P-type transistor 812, enable pin 806 is coupled to the gate of P-type transistor 820, enable pin 824 is coupled to the gate of P-type transistor 814, enable pin 828 is coupled to the gate of P-type transistor 822, and enable pin 802 is coupled to the gate of P-type transistor 810.

The transmission gate 834 and transistors 836, 838, 840, and 842 of shadow latch circuit 800 are similar to the corresponding components of shadow latch circuit 700. The output of transmission gate 834 is coupled to a first input port of NOR-gate 844, while a reset signal (or RST) is coupled to a second input of NOR-gate 844. The output of NOR-gate 844 (or zza_en_h) is coupled to the gates of P-type transistor 836 and N-type transistor 842. Delayed clocks clk9_1 and clk10 are coupled to the clock inputs of transmission gate 834. In one embodiment, clk9_1 is the clock signal delayed by 9 inverters while clk10 is the clock signal delayed by 10 inverters. Also, clk9_1 is coupled to the gate of P-type transistor 838 and clk10 is coupled to the gate of N-type transistor 840. It is noted that in other embodiments, shadow latch circuit 800 may include other components and/or shadow latch circuit 800 may be arranged in other suitable manners.

Figure 9:
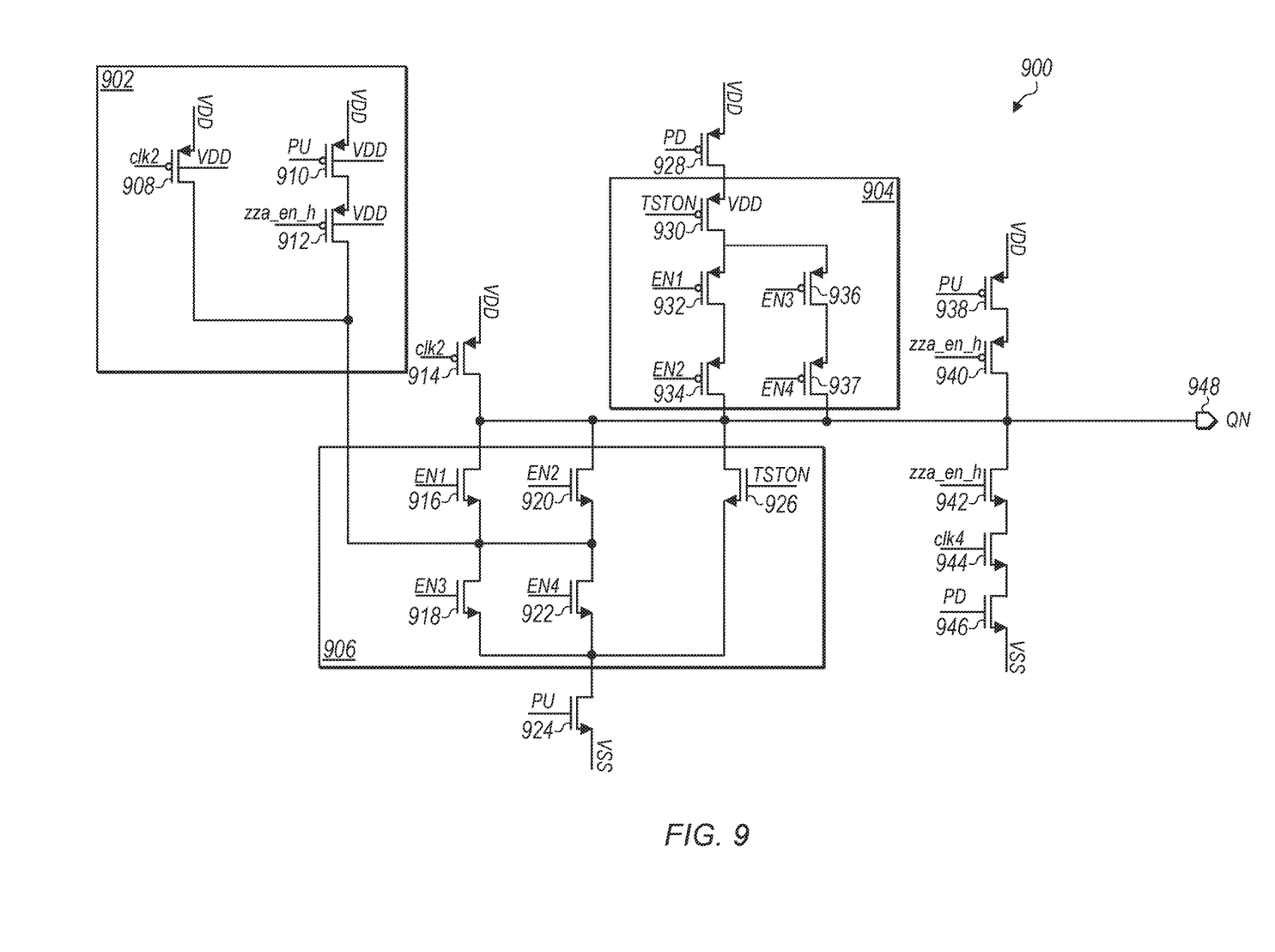
FIG. 9 is a circuit diagram of one embodiment of a clock-gating circuit with five enable pins.

Referring now to FIG. 9, a circuit diagram of one embodiment of a clock-gating circuit 900 with five enable pins is shown. Clock-gating circuit 900 is an alternate implementation of a clock-gating circuit with five enable pins. The structure of clock-gating circuit 900 includes similarities with clock-gating circuit 200 (of FIG. 2) but also has modifications to include five enable pins as compared to the single enable pin of clock-gating circuit 200. As shown in FIG. 9, clock-gating circuit 900 includes pre-charge logic 902, enable logic sub-circuit 904, enable logic sub-circuit 906, and various other transistors connected to node 948. Pre-charge logic 902 includes P-type transistors 908, 910, and 912. Enable logic sub-circuit 904 includes P-type transistors 930, 932, 934, 936, and 937 which receive the five separate enable signals on their gates. Also, enable logic sub-circuit 906 includes N-type transistors 916, 918, 920, 922, and 926 which receive the five separate enable signals on their gates.

Clock-gating circuit 900 also includes N-type transistor 924 which receives the pulse signal (or PU) on its gate. The drain of N-type transistor 924 is coupled to the sources of N-type transistors 918, 922, and 926. Additionally, clock-gating circuit 900 includes P-type transistors 938 and 940 and N-type transistors 942, 944, and 946. The signal "zza_en_h" generated by shadow latch circuit 800 (of FIG. 8) is coupled to the gates of P-type transistor 940 and N-type transistor 942. Clock-gating circuit 900 also includes P-type transistor 928 which receives the inverted pulse signal (or PD) on its gate. The drain of P-type transistor 928 is coupled to the source of P-type transistor 930. Also, clock-gating circuit 900 includes P-type transistor 914 which receives a delayed clock signal (or clk2) on its gate. The drain of P-type transistor 914 is coupled to output node 948 (or QN).

Figure 10:
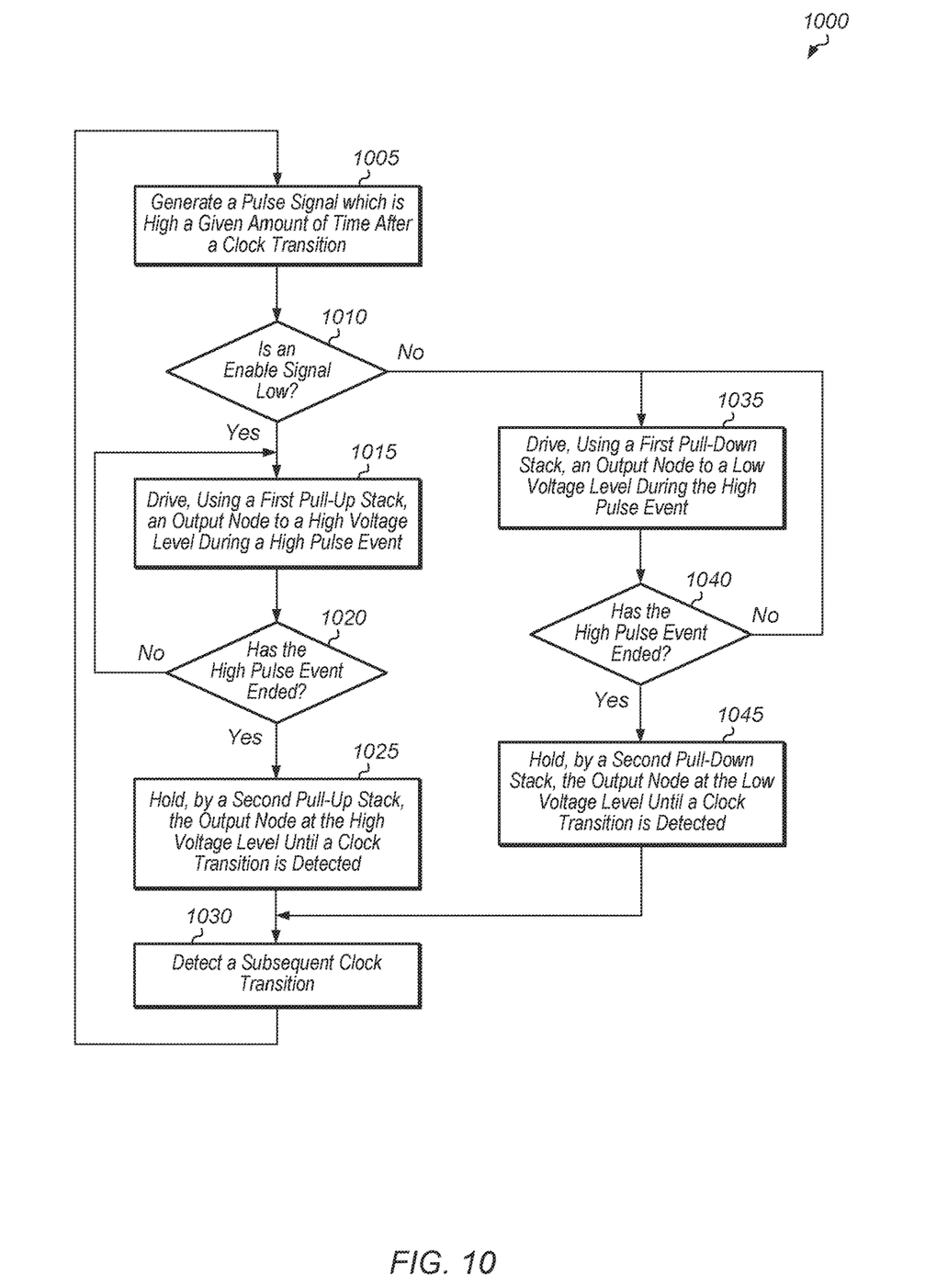
FIG. 10 is a flow diagram of one embodiment of a method for implementing a no-enable setup clock gater based on pulse.

Turning now to FIG. 10, a generalized flow diagram of one embodiment of a method 1000 for implementing a no-enable setup clock gater based on pulse is shown. For purposes of discussion, the steps in this embodiment are shown in sequential order. However, in other embodiments some steps may occur in a different order than shown, some steps may be performed concurrently, some steps may be combined with other steps, and some steps may be absent.

A circuit generates a pulse signal which is high a given amount of time after a clock transition (block 1005). In one embodiment, the clock transition is a positive edge (i.e., a transition from low to high) of a clock signal. If an enable signal is low (conditional block 1010, "yes" leg), a first pull-up stack drives an output node to a high voltage level during a high pulse event (block 1015). In other words, the first pull-up stack causes the output node to attain a high voltage level during the high pulse event when the enable signal is low. It is noted that the "output node" may also be referred to as a "state node". If the high pulse event ends (conditional block 1020, "yes" leg), then a second pull-up stack holds the output node at the high voltage level until a clock transition is detected (block 1025). It is noted that the second pull-up stack is connected in parallel with the first pull-up stack. After a subsequent clock transition is detected (block 1030), method 1000 returns to block 1005.

Otherwise, if the enable signal is high (conditional block 1010, "no" leg), a first pull-down stack drives the output node to a low voltage level during the high pulse event (block 1035). In other words, the first pull-down stack causes the output node to reach a low voltage level during the high pulse event when the enable signal is high. It is noted that the output node may be coupled to an inverter so that an output of the inverter is high when the enable signal is high. If the high pulse event ends (conditional block 1040, "yes" leg), then a second pull-down stack holds the output node at the low voltage level (block 1045). It is noted that the second pull-down stack is connected in parallel with the first pull-down stack. After a subsequent clock transition is detected (block 1030), method 1000 returns to block 1005.

Figure 11:
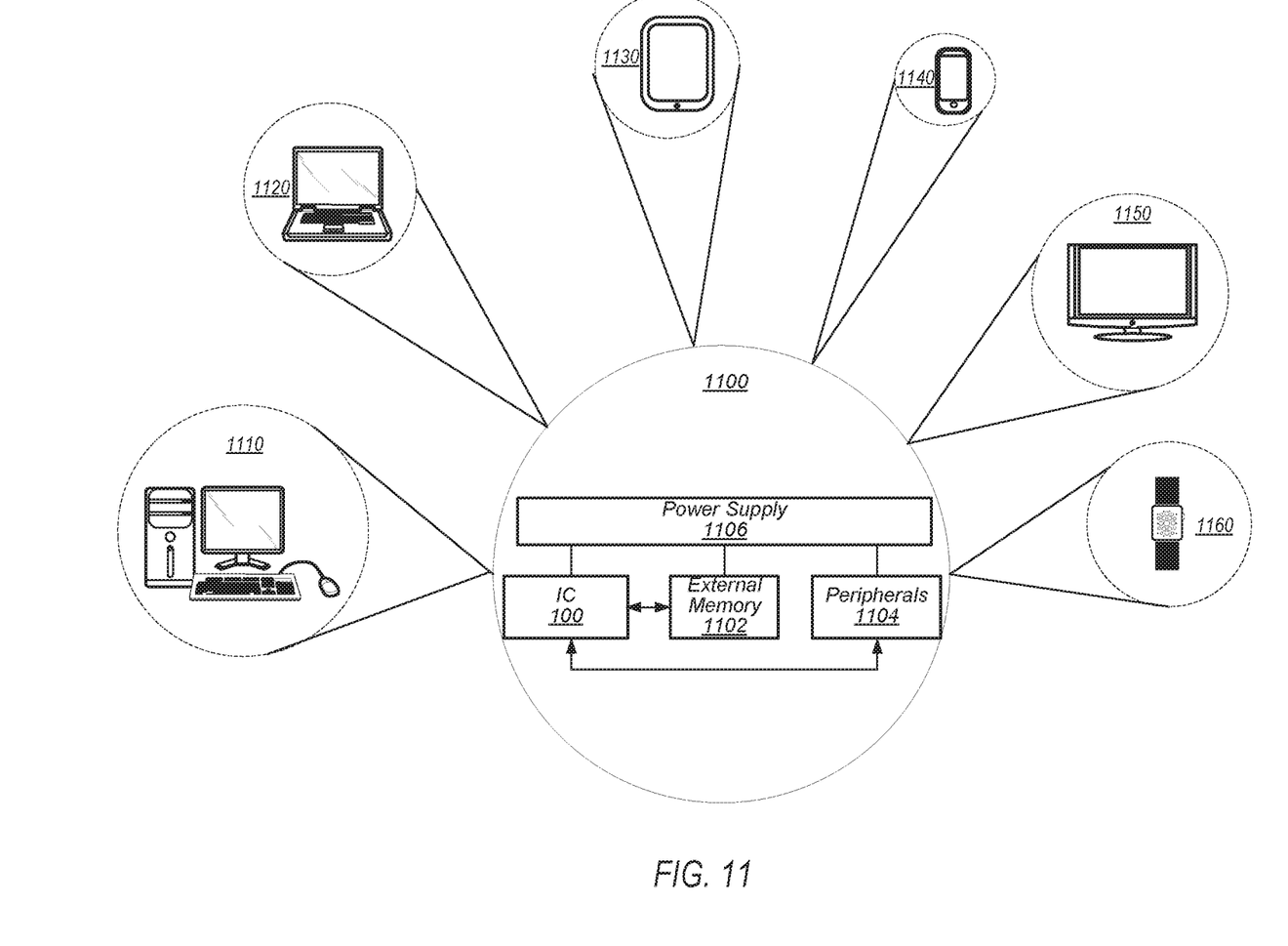
FIG. 11 is a block diagram of one embodiment of a system.

Referring now to FIG. 11, a block diagram of one embodiment of a system 1100 is shown. As shown, system 1100 may represent chip, circuitry, components, etc., of a desktop computer 1110, laptop computer 1120, tablet computer 1130, cell or mobile phone 1140, television 1150 (or set top box configured to be coupled to a television), wrist watch or other wearable item 1160, or otherwise. Other devices are possible and are contemplated. In the illustrated embodiment, the system 1100 includes at least one instance of integrated circuit (IC) 100 (of FIG. 1) coupled to one or more peripherals 1104 and the external memory 1102. A power supply 1106 is also provided which supplies the supply voltages to IC 100 as well as one or more supply voltages to the memory 1102 and/or the peripherals 1104. In various embodiments, power supply 1106 may represent a battery (e.g., a rechargeable battery in a smart phone, laptop or tablet computer). In some embodiments, more than one instance of IC 100 may be included (and more than one external memory 1102 may be included as well).

The memory 1102 may be any type of memory, such as dynamic random access memory (DRAM), synchronous DRAM (SDRAM), double data rate (DDR, DDR2, DDR3, etc.) SDRAM (including mobile versions of the SDRAMs such as mDDR3, etc., and/or low power versions of the SDRAMs such as LPDDR2, etc.), RAMBUS DRAM (RDRAM), static RAM (SRAM), etc. One or more memory devices may be coupled onto a circuit board to form memory modules such as single inline memory modules (SIMMs), dual inline memory modules (DIMMs), etc. Alternatively, the devices may be mounted with IC 100 in a chip-on-chip configuration, a package-on-package configuration, or a multi-chip module configuration.

The peripherals 1104 may include any desired circuitry, depending on the type of system 1100. For example, in one embodiment, peripherals 1104 may include devices for various types of wireless communication, such as wifi, Bluetooth, cellular, global positioning system, etc. The peripherals 1104 may also include additional storage, including RAM storage, solid state storage, or disk storage. The peripherals 1104 may include user interface devices such as a display screen, including touch display screens or multitouch display screens, keyboard or other input devices, microphones, speakers, etc.

Figure 12:
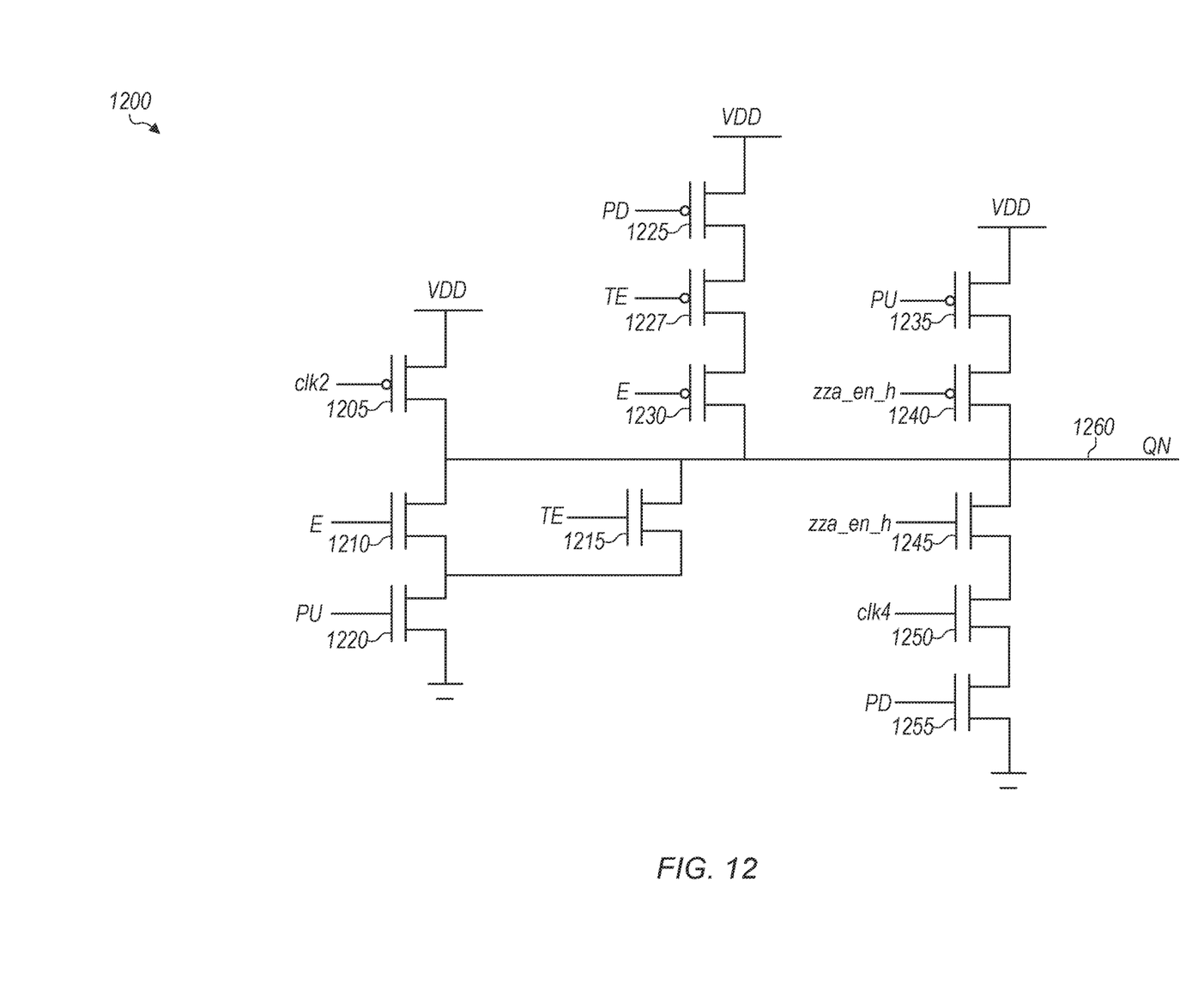
FIG. 12 is a circuit diagram illustrating another embodiment of a clock-gating circuit.

Turning now to FIG. 12, a circuit diagram illustrating another embodiment of a clock-gating circuit 1200 is shown. While clock-gating circuit 1200 is similar to clock-gating circuit 200 (of FIG. 2), there are some differences in the construction of clock-gating circuit 1200 that may be beneficial when used in certain scenarios. For example, clock-gating circuit 1200 includes P-type transistor 1227 and N-type transistor 1215, with the test enable (or "TE") signal coupled to the gates of P-type transistor 1227 and N-type transistor 1215. P-type transistor 1227 is coupled in series between P-type transistors 1225 and 1230, and N-type transistor 1215 is coupled in between QN node 1260 and the drain of N-type transistor 1220. Also, the "clk2" signal from pulse generator circuit 600 (of FIG. 6) is coupled to the gate of P-type transistor 1205, and the "clk4" signal from pulse generator circuit 600 is coupled to the gate of N-type transistor 1250. Still further, the "zza_en_h" signal from a shadow latch circuit (e.g., shadow latch circuit 800 of FIG. 8) is coupled to the gates of P-type transistor 1240 and N-type transistor 1245.

The other components of clock-gating circuit 1200 are the equivalent of the corresponding components of clock-gating circuit 200. For example, the arrangement of P-type transistors 1205, 1225, 1230, 1235, and 1240 within clock-gating circuit 1200 are the equivalent to the arrangement of P-type transistors 205, 225, 230, 235, and 240, respectively, of clock-gating circuit 200. Also, the arrangement of N-type transistors 1210, 1220, 1245, 1250, and 1255 of clock-gating circuit 1200 are the equivalent of the arrangement of N-type transistors 210, 220, 245, 250, and 255, respectively, of clock-gating circuit 200. It is noted that clock-gating circuit 1200 provides another non-limiting example of a clock-gating circuit. It should be understood that other variations in the construction of clock-gating circuits that take advantage of the techniques described herein are possible and are contemplated.

In various embodiments, program instructions of a software application may be used to implement the methods and/or mechanisms previously described. The program instructions may describe the behavior of hardware in a high-level programming language, such as C. Alternatively, a hardware design language (HDL) may be used, such as Verilog. The program instructions may be stored on a non-transitory computer readable storage medium. Numerous types of storage media are available. The storage medium may be accessible by a computer during use to provide the program instructions and accompanying data to the computer for program execution. In some embodiments, a synthesis tool reads the program instructions in order to produce a netlist comprising a list of gates from a synthesis library.

It should be emphasized that the above-described embodiments are only non-limiting examples of implementations. Numerous variations and modifications will become apparent to those skilled in the art once the above disclosure is fully appreciated. It is intended that the following claims be interpreted to embrace all such variations and modifications.

What is claimed is:
1. A circuit configured to:
receive a clock signal on a gate of a pull-up transistor;
receive an enable signal and a pulse signal on gates of the first pair of N-type transistors of a first pull-down stack;

receive the enable signal and an inverted pulse signal on gates of the first pair of P-type transistors of the first pull-up stack;

generate a pulse signal based on the clock signal;

cause, using the first pull-up stack, an output node to attain the high voltage level during the pulse event when the enable signal is low; and cause, using the first pull-down stack, the output node to attain the low voltage level during the pulse event when the enable signal is high.

2. The circuit as recited in claim 1, further comprising a second pull-up stack of a second pair of P-type transistors, wherein the circuit is configured to receive the pulse signal on a gate of a first P-type transistor of the second pair of P-type transistors of the second pull-up stack.

3. The circuit as recited in claim 2, wherein the second pull-up stack is configured to hold the output node at the high voltage level after the pulse event has ended until a clock transition is detected.

4. The circuit as recited in claim 2, wherein the second pull-up stack is arranged in parallel with the first pull-up stack.

5. The circuit as recited in claim 1, further comprising a second pull-down stack of three N-type transistors, wherein the circuit is configured to receive the inverted pulse signal on a gate of a first N-type transistor of the second pull-down stack.

6. The circuit as recited in claim 5, wherein the second pull-down stack is configured to hold the output node at the low voltage level after the pulse event has ended until a clock transition is detected.

7. A method comprising:

receiving a clock signal on a gate of a pull-up transistor;

receiving an enable signal and a pulse signal on gates of the first pair of N-type transistors of a first pull-down stack;

receiving the enable signal and an inverted pulse signal on gates of the first pair of P-type transistors of the first pull-up stack;

generating a pulse signal based on the clock signal;

causing, using the first pull-up stack, an output node to attain the high voltage level during the pulse event when the enable signal is low; and causing, using the first pull-down stack, the output node to attain the low voltage level during the pulse event when the enable signal is high.

8. The method as recited in claim 7, further comprising receiving the pulse signal on a gate of a first P-type transistor of a second pair of P-type transistors of a second pull-up stack.

9. The method as recited in claim 8, further comprising holding, by the second pull-up stack, the output node at the high voltage level after the pulse event has ended until a clock transition is detected.

10. The method as recited in claim 8, wherein the second pull-up stack is arranged in parallel with the first pull-up stack.

11. The method as recited in claim 7, further comprising receiving the inverted pulse signal on a gate of a first N-type transistor of a second pull-down stack.

12. The method as recited in claim 11, further comprising holding, by the second pull-down stack, the output node at the low voltage level after the pulse event has ended until a clock transition is detected.

13. A system comprising:

a pulse generator circuit configured to generate a pulse signal based on a clock signal; and a clock-gating circuit configured to:

receive the clock signal on a gate of a pull-up transistor;

receive an enable signal and the pulse signal on gates of the first pair of N-type transistors of a first pull-down stack;

receive the enable signal and an inverted pulse signal on gates of the first pair of P-type transistors of the first pull-up stack;

cause, using the first pull-up stack, an output node to attain the high voltage level during the pulse event when the enable signal is low; and cause, using the first pull-down stack, the output node to attain the low voltage level during the pulse event when the enable signal is high.

14. The system as recited in claim 13, wherein the clock-gating circuit further comprises a second pull-up stack of a second pair of P-type transistors, wherein the clock-gating circuit is configured to receive the pulse signal on a gate of a first P-type transistor of the second pair of P-type transistors of the second pull-up stack.

15. The system as recited in claim 14, wherein the second pull-up stack is configured to hold the output node at the high voltage level after the pulse event has ended until a clock transition is detected.

16. The system as recited in claim 14, wherein the second pull-up stack is arranged in parallel with the first pull-up stack.

17. The system as recited in claim 13, wherein the clock-gating circuit further comprises a second pull-down stack of three N-type transistors, wherein the clock-gating circuit is configured to receive the inverted pulse signal on a gate of a first N-type transistor of the second pull-down stack.

\* \* \* \* \*